United States Patent
Gezici et al.

(10) Patent No.: US 8,111,767 B2
(45) Date of Patent: Feb. 7, 2012

(54) ADAPTIVE SLIDING BLOCK VITERBI DECODER

(75) Inventors: Sinan Gezici, Ankara (TR); Chunjie Duan, Medfield, MA (US); Jinyun Zhang, Cambridge, MA (US); Rajesh Garg, College Station, TX (US)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 621 days.

(21) Appl. No.: 11/755,890

(22) Filed: May 31, 2007

(65) Prior Publication Data

US 2008/0298513 A1    Dec. 4, 2008

(51) Int. Cl.
*H04L 00/04*    (2006.01)
(52) U.S. Cl. .......................... 375/262; 375/260; 714/786
(58) Field of Classification Search ................... 375/241
See application file for complete search history.

(56) References Cited

U.S. PATENT DOCUMENTS

| | | | | | |
|---|---|---|---|---|---|
| 3,758,713 | A | * | 9/1973 | Sekimoto | 375/240.12 |
| 4,677,625 | A | * | 6/1987 | Betts et al. | 714/792 |
| 4,993,025 | A | * | 2/1991 | Vesel et al. | 370/450 |
| 5,220,570 | A | * | 6/1993 | Lou et al. | 714/791 |
| 5,541,955 | A | * | 7/1996 | Jacobsmeyer | 375/222 |
| 5,822,341 | A | * | 10/1998 | Winterrowd et al. | 714/795 |
| 5,832,001 | A | * | 11/1998 | Choi | 714/790 |
| 5,887,036 | A | * | 3/1999 | Temerinac | 375/341 |
| 5,933,462 | A | * | 8/1999 | Viterbi et al. | 375/341 |
| 6,094,465 | A | * | 7/2000 | Stein et al. | 375/346 |
| 6,141,168 | A | * | 10/2000 | Takahashi et al. | 360/66 |
| 6,222,889 | B1 | * | 4/2001 | Lee | 375/265 |
| 6,240,145 | B1 | * | 5/2001 | Koizumi | 375/341 |
| 6,259,749 | B1 | * | 7/2001 | Andoh | 375/341 |
| 6,351,839 | B1 | * | 2/2002 | Lee et al. | 714/795 |
| 6,384,858 | B1 | * | 5/2002 | Limberg | 348/21 |
| 6,408,420 | B1 | * | 6/2002 | Todoroki | 714/795 |
| 6,738,941 | B1 | * | 5/2004 | Todoroki | 714/755 |
| 6,810,094 | B1 | * | 10/2004 | Lu | 375/341 |
| 6,836,511 | B1 | * | 12/2004 | Marukawa | 375/232 |
| 6,883,021 | B2 | * | 4/2005 | Ahmed et al. | 709/213 |
| 7,023,935 | B2 | * | 4/2006 | Cao et al. | 375/341 |

(Continued)

OTHER PUBLICATIONS

A. J. Viterbi. "Error Bounds for Convolutional Coding and an Asymptotically Optimum Decoding Algorithm," IEEE Trans. Inform. Theory, vol. IT-13, No. 2., Apr. 1967, pp. 260-269.

(Continued)

*Primary Examiner* — Chieh M Fan
*Assistant Examiner* — Santiago Garcia
(74) *Attorney, Agent, or Firm* — Buchanan Ingersoll & Rooney PC

(57) ABSTRACT

An adaptive sliding block Viterbi decoder (ASBVD) includes forward and backward Viterbi processors, a state estimator and a control unit. The processors generate metrics of states and of transitions between the states associated with an encoder, based on encoded input information symbols received via a communications channel. Each processor includes a plurality of buffers for storing information symbols so that a number of the encoded input information symbols can be concurrently decoded. The state estimator estimates a current state of a code trellis based on the generated metrics, and the processors decode the stored information symbols based on the estimated current state. The control unit adapts the number of encoded input information symbols to be concurrently decoded based on a condition of the communications channel, and selectively controls the number of buffers that are enabled in accordance with the number of encoded input information symbols to be concurrently decoded.

22 Claims, 4 Drawing Sheets

U.S. PATENT DOCUMENTS

| | | | |
|---|---|---|---|
| 7,046,746 B1* | 5/2006 | Keaney et al. | 375/341 |
| 7,117,426 B2* | 10/2006 | Wu et al. | 714/795 |
| 7,165,000 B2* | 1/2007 | Ashley et al. | 702/107 |
| 7,191,083 B2* | 3/2007 | Ashley et al. | 702/107 |
| 7,324,546 B1* | 1/2008 | Rowett et al. | 370/458 |
| 7,571,376 B2* | 8/2009 | Cho et al. | 714/795 |
| 7,603,613 B2* | 10/2009 | Pisek et al. | 714/795 |
| 2002/0046251 A1* | 4/2002 | Siegel | 709/213 |
| 2002/0146023 A1* | 10/2002 | Myers | 370/412 |
| 2003/0179720 A1* | 9/2003 | Cuny | 370/310 |
| 2004/0037373 A1* | 2/2004 | Ashley et al. | 375/341 |
| 2004/0087312 A1* | 5/2004 | Cao et al. | 455/453 |
| 2004/0243908 A1* | 12/2004 | Box et al. | 714/759 |
| 2005/0034051 A1* | 2/2005 | Chun et al. | 714/795 |
| 2005/0235178 A1* | 10/2005 | Starr et al. | 714/704 |
| 2006/0168501 A1* | 7/2006 | Cho et al. | 714/795 |
| 2006/0176968 A1* | 8/2006 | Keaney et al. | 375/260 |
| 2006/0294324 A1* | 12/2006 | Chang et al. | 711/154 |
| 2007/0036022 A1* | 2/2007 | Song | 365/233 |
| 2007/0076826 A1* | 4/2007 | Stockmanns et al. | 375/341 |
| 2007/0113161 A1* | 5/2007 | Lingam et al. | 714/796 |
| 2007/0150775 A1* | 6/2007 | Hong et al. | 714/701 |
| 2007/0165750 A1* | 7/2007 | Liu et al. | 375/341 |
| 2007/0168847 A1* | 7/2007 | Pisek et al. | 714/795 |
| 2007/0277081 A1* | 11/2007 | Liao | 714/795 |
| 2008/0072125 A1* | 3/2008 | Norris et al. | 714/792 |
| 2008/0072126 A1* | 3/2008 | Norris et al. | 714/792 |
| 2008/0072128 A1* | 3/2008 | Anders et al. | 714/795 |
| 2008/0112514 A1* | 5/2008 | Pisek | 375/341 |
| 2008/0144454 A1* | 6/2008 | Bottemiller et al. | 369/47.14 |
| 2008/0178062 A1* | 7/2008 | Norris et al. | 714/786 |
| 2008/0178063 A1* | 7/2008 | Norris et al. | 714/786 |
| 2009/0080514 A1* | 3/2009 | Chen | 375/240.02 |
| 2009/0110118 A1* | 4/2009 | Yousef | 375/320 |
| 2009/0185613 A1* | 7/2009 | Agazzi et al. | 375/232 |
| 2009/0274138 A1* | 11/2009 | Glickman et al. | 370/345 |

OTHER PUBLICATIONS

H.-D. Lin and D. G. Messerschmitt. "Algorithms and Architectures for Concurrent Viterbi Decoding," Proc. ICC'89, vol. 2, Jun. 1989, pp. 836-840.

P. J. Black and T. H.-Y. Meng. "A 1-Gb/s Four-State, Sliding Block Viterbi Decoder," IEEE Journal of Solid-State Circuits, vol. 32, No. 6, Jun. 1997, pp. 797-805.

* cited by examiner

ADAPTIVE SLIDING BLOCK VITERBI DECODER

FIELD OF THE INVENTION

The present invention relates generally to decoding of encoded symbols. More particularly, the present invention relates to decoding of convolutionally encoded symbols using an algorithm based on Viterbi decoding.

BACKGROUND

Encoding an information sequence at a transmitter and decoding the received sequence at a receiver is one way to reduce errors caused by undesirable channel/environment conditions. For example, convolutional encoding is an error-correcting scheme, which passes an information sequence to be transmitted through a linear finite state shift register to generate an encoded information sequence. The Viterbi algorithm is recognized as the optimal algorithm for decoding a received convolutionally encoded information sequence at the receiver. (See, A. J. Viterbi, "Error bounds for convolutional coding and an asymptotically optimum decoding algorithm," IEEE Trans. Info. Theory, pp. 260-269, April 1967). The Viterbi algorithm has many applications, including digital communications, speech recognition and magnetic recording, among others.

A convolutional encoder can be implemented as a finite state machine in which the transitions between states are determined by the input sequence. Thus, a Viterbi decoder can operate by first estimating possible states and transitions between states (i.e., to obtain a code trellis diagram) and then estimating the most likely transmitted sequence using traceback operations. Theoretically, the Viterbi decoder can use the entire sequence input to the decoder to optimally estimate the most likely transmitted sequence but, in practice, it is not desirable to wait for the entire sequence before starting to decode. Thus, in one implementation, the Viterbi decoder can be configured to estimate one symbol for every L symbols input to the decoder. L is referred to as the "traceback length" and, for example, can be chosen as five times the constraint length of the convolutional code.

Various techniques can be applied to increase Viterbi decoder speed with respect to the number of symbols decoded per unit time. For example, look-ahead architectures can be employed that increase throughput by calculating a number of metrics at each clock cycle. (See, Lin et al., "Algorithms and architectures for concurrent Viterbi decoding," Proc. ICC '89, vol. 2, pp. 836-840, June 1989). Additionally, a sliding-block Viterbi decoder (SBVD) can be employed to decode a number of symbols (bits) each clock cycle. In other words, instead of decoding one bit per unit time, the SBVD decodes M bits per unit time. (See, Black et. al., "A 1-Gb/s Four-State, Sliding Block Viterbi Decoder," IEEE Journal of Solid-State Circuits, vol. 32, no. 6, pp. 797-805, June 1997).

BRIEF SUMMARY

In accordance with an embodiment of the present invention, an adaptive sliding block Viterbi decoder (ASBVD) includes forward and backward Viterbi processors, a state estimator and a control unit. The forward and backward Viterbi processors are configured to generate metrics of states and of transitions between the states associated with an encoder, based on encoded input information symbols received via a communications channel. Each processor includes a plurality of buffers for storing information symbols so that a number of the encoded input information symbols can be concurrently decoded. The state estimator is configured to estimate a current state of a code trellis based on the generated metrics. The processors decode the stored information symbols based on the estimated current state. The control unit is configured to adapt the number of encoded input information symbols to be concurrently decoded based on a condition of the communications channel, and selectively control the number of buffers that are enabled in accordance with the number of encoded input information symbols to be concurrently decoded.

In accordance with another embodiment of the present invention, a system for adaptive sliding block Viterbi decoding includes means for adapting a number of encoded input information symbols to be concurrently decoded based on a condition of a communications channel via which the encoded input information symbols are received. The system also includes means for forward processing and backward processing the encoded input information symbols to generate metrics of states and of transitions between the states associated with an encoder. The processing means includes a plurality of means for storing information symbols so that the number of encoded input information symbols can be concurrently decoded. Further, the system includes means for controlling the number of means for storing that are enabled in accordance with the number of encoded input information symbols to be concurrently decoded. Means for estimating a current state of a code trellis based on the generated metrics are included, and the processing means further includes means for decoding the stored information symbols based on the estimated current state.

In accordance with a further embodiment of the present invention, a method for adaptive sliding block Viterbi decoding includes adapting a number of encoded input information symbols to be concurrently decoded based on a condition of a communications channel via which the encoded input information symbols are received. The method also includes processing the encoded input information symbols to generate metrics of states and of transitions between the states associated with an encoder. The step of processing includes storing the information symbols using buffers so that the number of encoded input information symbols can be concurrently decoded. Further, the method includes controlling the number of buffers that are enabled in accordance with the number of encoded input information symbols to be concurrently decoded, and estimating a current state of a code trellis based on the generated metrics. The step of processing includes decoding the stored information symbols based on the estimated current state.

In accordance with yet another embodiment of the present invention, an adaptive decoder includes first and second processors, a state estimator and a control unit. The first and second processors are configured to generate metrics of states and of transitions between the states associated with an encoder, based on encoded input information symbols received via a communications channel. Each processor includes a plurality of buffers for storing information symbols so that a number of the encoded input information symbols can be concurrently decoded. The state estimator is configured to estimate a current state of a code trellis based on the generated metrics. The processors decode the stored information symbols based on the estimated current state. The control unit is configured to adapt the number of encoded input information symbols to be concurrently decoded based on a condition of the communications channel, and selectively control the number of buffers that are enabled in accordance with the number of encoded input information symbols to be concurrently decoded.

BRIEF DESCRIPTION OF THE DRAWINGS

Objects and advantages of the present disclosure will be understood by reading the following detailed description in conjunction with the drawings in which.

DETAILED DESCRIPTION

Overview

Figure 1:
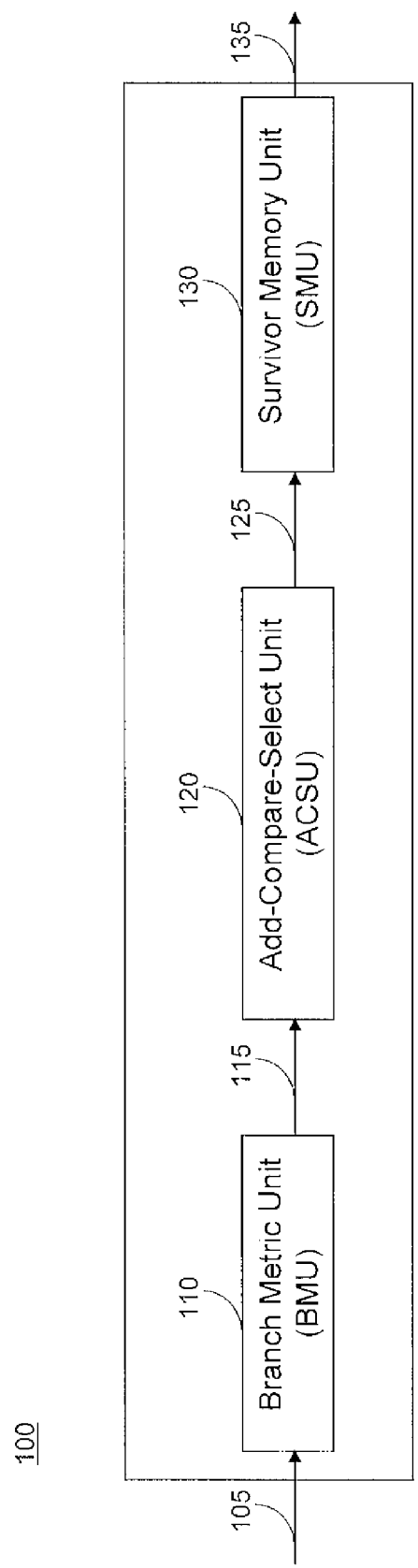
FIG. 1 illustrates a block diagram of a Viterbi decoder.

FIG. 1 illustrates a block diagram of an exemplary Viterbi decoder 100. Viterbi decoder 100 can include a branch metric unit (BMU) 110, an add-compare-select unit (ACSU) 120, and a survivor memory unit (SMU) 130. The BMU 130 can calculate metrics for transitions between various states 115, called "branch metrics," based on a received input sequence 105. The ACSU 120 can calculate metrics for different states based on the branch metrics 115 and determine and output most likely transitions and states 125. Using the most likely transitions and states 125, the SMU 130 can estimate a transmitted sequence 135 by tracing back among stored transitions and states. Detailed implementations of the BMU 110, ACSU 120, and SMU 130 will be known to persons skilled in the art.

Figure 2:
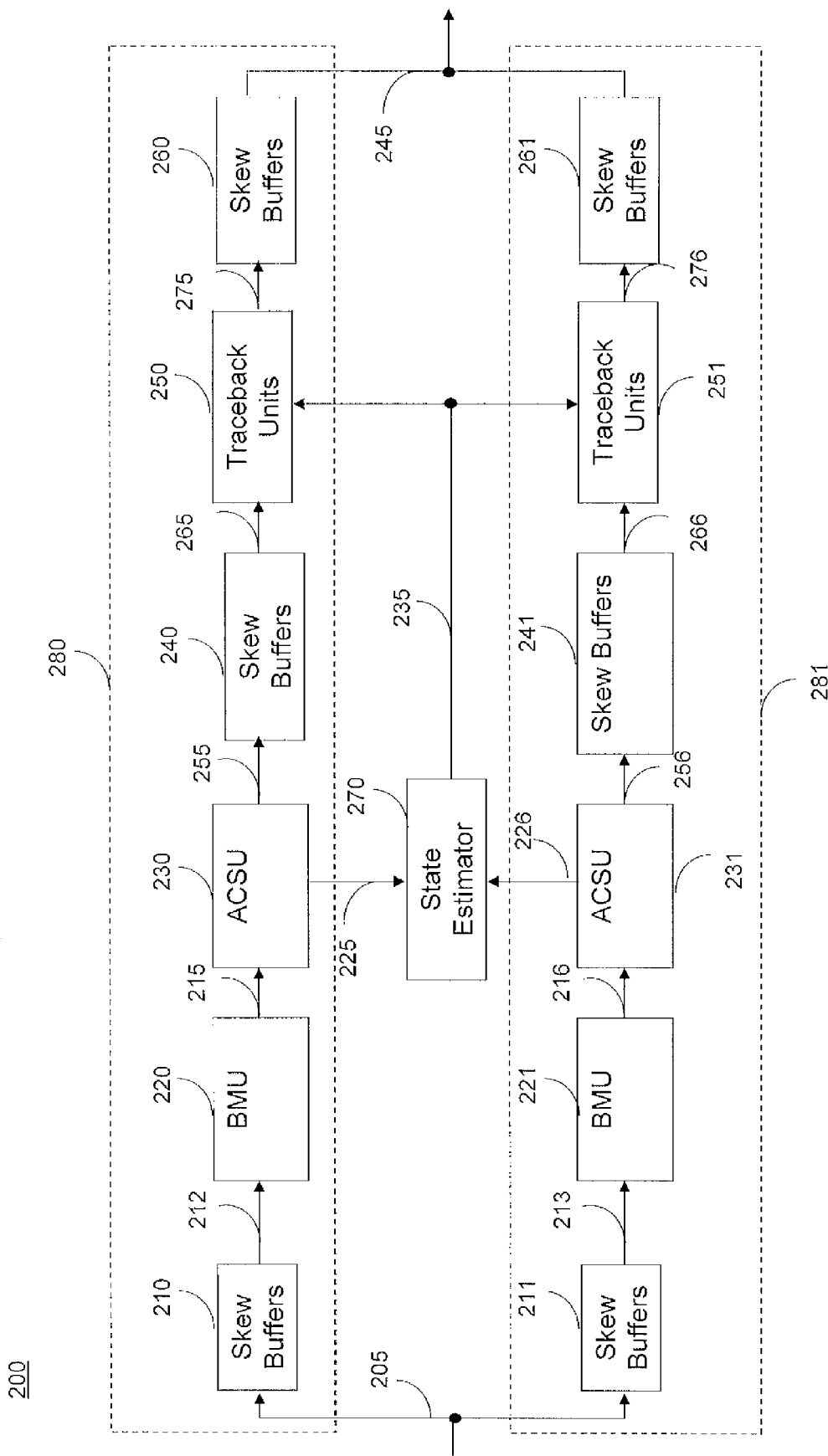
FIG. 2 illustrates a block diagram of a sliding block Viterbi decoder (SBVD)

FIG. 2 illustrates a block diagram of an exemplary SBVD 200. SBVD 200 can include a backward Viterbi processor 280, a forward Viterbi processor 281, and a state estimator 270. Forward and backward Viterbi processors 280 and 281 include first skew buffers 210 and 211, BMUs 220 and 221, ACSUs 230 and 231, second skew buffers 240 and 241, traceback units 250 and 251, and third skew buffers 260 and 261, respectively. The forward Viterbi processor 280 can be configured to process a received stream of input symbols 205 starting from the middle of the stream and looking forward, while the backward Viterbi processor 281 can be configured to process the input symbols 205 starting from the middle of the stream and looking backward.

To facilitate processing a number of the input symbols 205 at the same time, the SBVD 200 can employ banks of skew buffers 210, 211, 240, 241, 260 and 261. The input symbols 205 can be fed to first skew buffers 210 and 211, which store the input symbols and generate re-timed input streams 212 and 213. The BMUs 220 and 221 can calculate branch metrics 215 and 216, respectively, for transitions between states. Then, ACSUs 230 and 231 can calculate state metrics 225 and 226 based on the branch metrics 215 and 216, respectively. The state estimator 270 can estimate a current state 235 of a code trellis associated with the encoder based on the state metrics 225 and 226. Second skew buffers 240 and 214 re-time ACSU output decision bits 255 and 256 and generate re-timed ACSU outputs 265 and 266, respectively. Next, the traceback units 250 and 251 can use the state estimate 235 and re-timed ACSU outputs 265 and 266 to calculate most likely information symbols 275 and 276, respectively. After re-timing the most likely information symbols 275 and 276, third skew buffers 260 and 261 can generate decoded output information bits 245.

Although the SBVD 200 can achieve higher throughput than the conventional Viterbi decoder 100, the complexity of the SBVD 200 is also considerably greater than that of the Viterbi decoder 100, as illustrated by FIGS. 1 and 2. For example, if M represents the number of symbols decoded per clock cycle, then the skew buffers 240, 241, 260 and 261 of the SBVD 200 will each include a fixed number of branches (e.g., delay chains) of skew buffers that is based on the value of M. In particular, the hardware complexity of the skew buffers in the SBVD 200 will increase with $M^2$. That is, the total number of skew buffers is proportional to $M^2$. The size of buffers 210 and 211, on the other hand, is proportional to the number of input symbols J, not the number of symbols decoded per clock cycle M.

Accordingly, an adaptive sliding block Viterbi decoder (ASBVD) is described herein for decoding information symbols that are encoded by a convolutional encoder, in accordance with one or more embodiments of the present disclosure. The adaptive nature of the ASBVD facilitates a trade-off between symbol decoding rate and power consumption. The explanation will be by way of exemplary embodiments to which the present invention is not limited.

Exemplary Adaptive Sliding Block Viterbi Decoder (ASBVD)

Although throughput can be scaled by M by using a SBVD, the hardware complexity of the SBVD with respect to buffers also scales with $M^2$. Because more buffers will consume more power, the high complexity of the SBVD can pose a problem for low-power implementations. For example, for receivers with multiple throughput options, a large value of M could be used to meet the highest throughput options, but for the lower throughput options, this large M would be redundant. That is, the number of buffers in the SBVD would be selected to accommodate the highest throughput option but not all of those buffers would be needed to accommodate the lower throughout options.

Therefore, an ASBVD is described herein that can not only adapt the number of symbols to be decoded in response to channel conditions (e.g., data rate) but can also adapt the number of buffers that are enabled in a SBVD in accordance with the number of symbols to be concurrently decoded. Thus, even if the SBVD is designed with a number of buffers to accommodate the highest throughout option, power can be saved by disabling the buffers that are not being used for the lower throughput options. For example, to disable the buffers that are not being used, corresponding power supply or clock signals of the buffers not being used can be disabled. In this way, significant power savings can be achieved, particularly for lower throughput applications.

Figure 3:
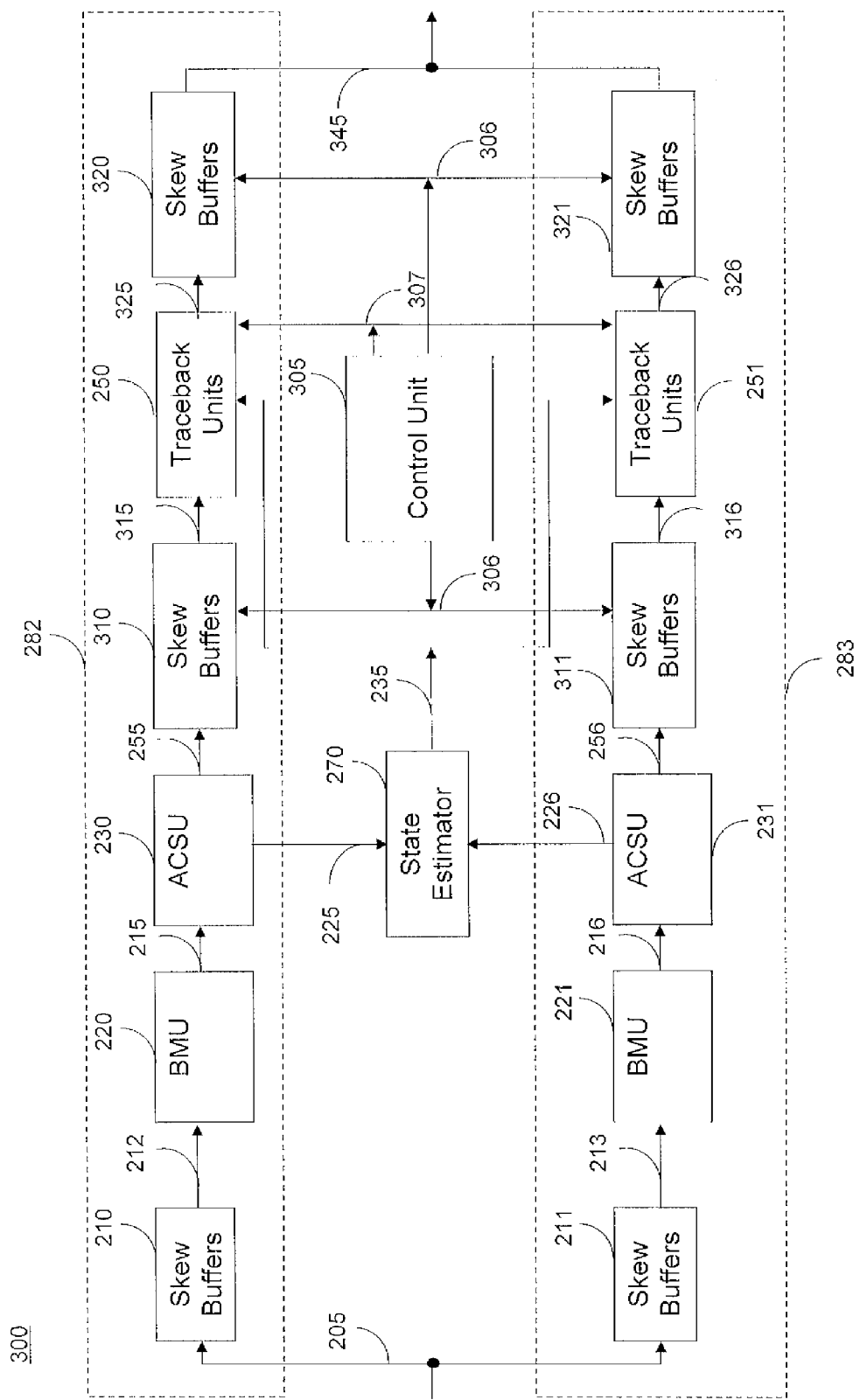
FIG. 3 illustrates a block diagram of an adaptive sliding block Viterbi decoder (ASBVD), in accordance with an exemplary embodiment of the present disclosure.

FIG. 3 illustrates a block diagram of an ASBVD 300, in accordance with an exemplary embodiment of the present disclosure. In accordance with an aspect of the present disclosure, the ASBVD 300 can be implemented in conjunction with a computer-based system, including hardware, software, firmware, or combinations thereof. As shown in FIG. 3, ASBVD 300 includes a backward Viterbi processor 282, a forward Viterbi processor 283, a state estimator 270, and a control unit 305.

Backward and forward Viterbi processors 282 and 283 can include the first skew buffer units 210 and 211, BMUs 220 and 221, ACSUs 230 and 231, second skew buffer units 310 and 311, the traceback units 250 and 251, and third skew buffer units 320 and 321, respectively. The encoded input information symbols 205, which are received via a communications channel, can be fed to the first skew buffer units 210 and 211, which can be used to store/re-time the input stream of encoded information symbols 205. That is, to process more than one encoded information symbol at a time, the first skew buffer units 210 and 211 can be used to convert a serial input stream of encoded information symbols to a parallel input stream of encoded information symbols that can be concurrently decoded. Further, the control unit 305 can be configured to detect a condition of the communications channel, such as data rate, among other conditions, and can adapt the number of encoded input information symbols to be concurrently decoded based on the detected channel condition.

The BMUs 220 and 221, can use the re-timed input streams 212 and 213 to calculate the branch metrics 215 and 216 describing transitions between states of a convolutional encoder. The ACSUs 230 and 231 can calculate state metrics 225 and 226 based on the branch metrics 215 and 216. The state estimator 270 can then estimate a current state 235 of a code trellis based on the state metrics 225 and 226. The second skew buffer units 310 and 311 can re-time the information symbol streams 255 and 256 output by ACSUs 230 and 231, respectively. The traceback units 250 and 251 can then use re-timed information symbol streams 315 and 316 output by the second skew buffer units 310 and 311, together with the estimated current state 235 to calculate most likely information symbol sequences 325 and 326. The third skew buffer units 320 and 321 can re-time the most likely information symbol sequences 325 and 326 to generate decoded output information bits 345.

Figure 4:
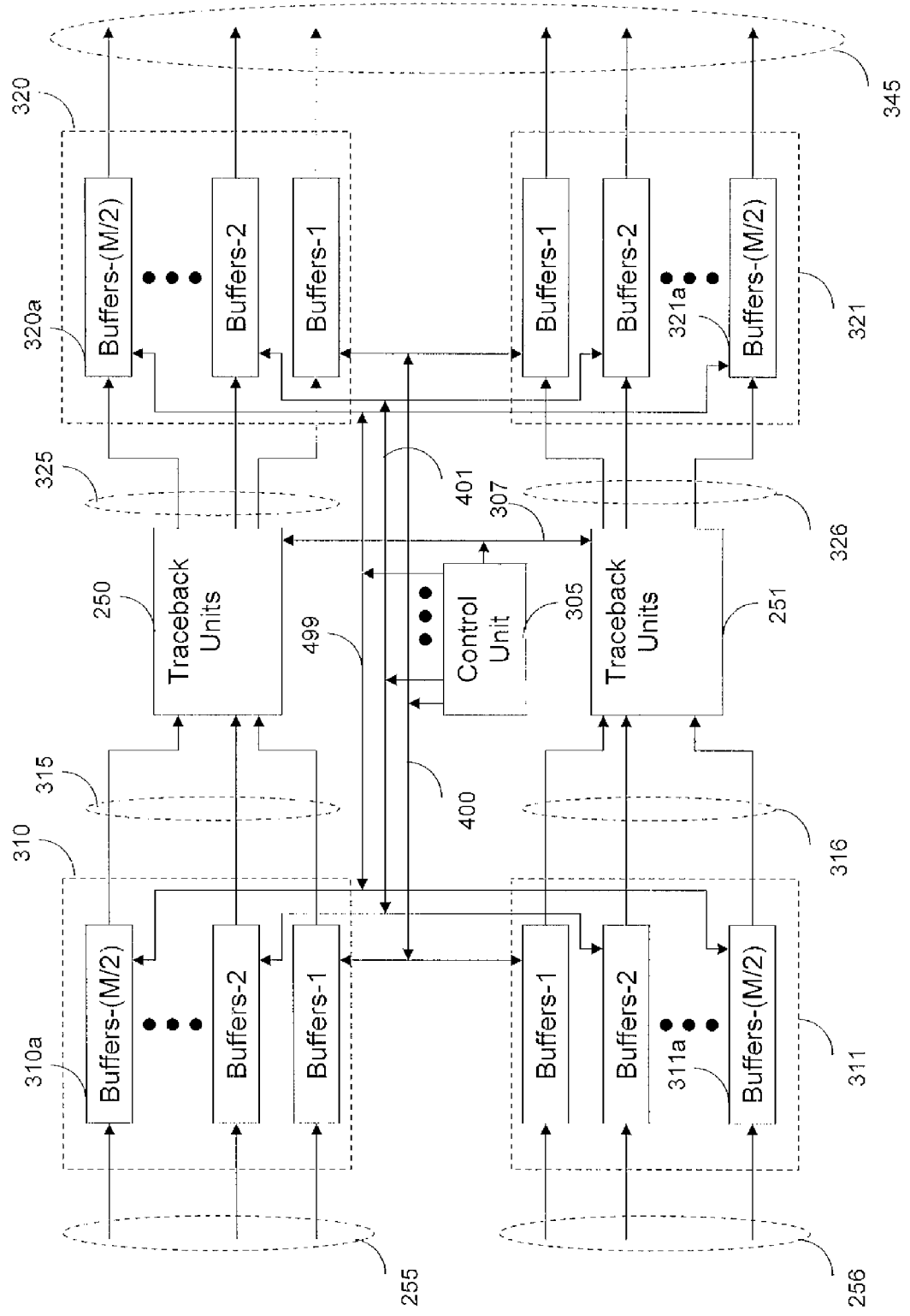
FIG. 4 illustrates detailed control structure of the ASBVD, illustrated in FIG. 3, in accordance with an exemplary embodiment of the present disclosure.

The control unit 305 can generate control signals 306 to control second skew buffer units 310 and 311 and third skew buffer units 320 and 321, as described in detail in conjunction with FIG. 4. Depending on the number of encoded input information symbols to be concurrently decoded (e.g., the value of M) determined based on the detected channel condition, some branches of skew buffers in the skew buffer units 310, 311, 320 and 321 can be disabled to reduce power consumption, as compared to a non-adaptive SBVD implementation. Additionally, it may be appropriate for a practical implementation for control unit 305 to generate control signals 307 to synchronize the traceback units 250 and 251 in accordance with the value of M and the number of enabled/disabled branches of skew buffers.

FIG. 4 illustrates detailed control structure of the control unit 305, illustrated in FIG. 3, in accordance with an exemplary embodiment of the present disclosure. As shown in FIG. 4, second skew buffer units 310 and 311 and third skew buffer units 320 and 321 can each be implemented as M/2 parallel branches of skew buffers.

Parallel output signals 255 and 256 from ACSUs 230 and 235 can be fed into the second skew buffer units 310 and 311, respectively, which can output re-timed parallel output signals 315 and 316. The re-timed parallel output signals 315 and 316 can be fed into the trace-back units 250 and 251, respectively, and parallel output signals 325 and 326 can be re-timed by the third skew buffer units 320 and 321, respectively, so that the parallel stream of decoded information bits 345 can be obtained.

In an embodiment, in response to a decrease in the number M of encoded input information symbols to be concurrently decoded based on the detected channel condition, the control unit 305 can generate control signals 400, 401, . . . 499 to disable some of the branches of skew buffers in second and third skew buffer units 310, 311, 320 and 321, as shown in FIG. 4. For example, to reduce the number of symbols concurrently decoded per clock cycle from a current value of M to M-2, the control unit 305 can send disable signals 499 to the last branches 310a, 311a, 320a and 321a in the skew buffer units 310, 311, 320 and 321, respectively. By starting the disabling from the last branches in the skew buffer units, more power savings can be achieved due to the structure of the ASBVD, which can be implemented with more buffers in the last branches than in the first branches of skew buffers, where the "first" branches are chronologically filled first with incoming data, while the "last" branches are filled last. Persons skilled in the art will understand, however, that other disabling orders/structures can also be implemented.

Similarly, in another embodiment, in response to an increase in the number M of encoded input information symbols to be concurrently decoded based on the detected channel condition, the control unit 305 can generate the control signals 400, 401, . . . 499 to enable some of the branches of skew buffers in second and third skew buffer units 310, 311, 320 and 321 that might have been previously disabled.

In an embodiment, the disable control operation can be implemented by not clocking the buffers in corresponding branches of skew buffers to be disabled in response to the control signals 400, 401, . . . 499 (e.g., by stopping the clock signal connected to the related buffers), or by not powering the buffers in corresponding branches of skew buffers to be disabled in response to the control signals 400, 401, . . . 499 (e.g., by disconnecting the power supply connections of the related buffers). Likewise, the enable control operation can be implemented by clocking the buffers in corresponding branches of skew buffers to be enabled in response to the control signals 400, 401, . . . 499 (e.g., by feeding the clock signal to the related buffers), or by powering the buffers in corresponding branches of skew buffers to be enabled in response to the control signals 400, 401, . . . 499 (e.g., by connecting the power supply connections of the related buffers). Persons skilled in the art will understand that other buffer enable/disable control operations can also be implemented.

CONCLUSION

The present invention has been described with reference to exemplary embodiments. However, it will be apparent to those skilled in the art that it is possible to embody the invention in specific forms other than those described above without departing from the spirit of the invention.

Accordingly, the various embodiments described herein are illustrative, and they should not be considered restrictive in any way. The scope of the invention is given by the appended claims, rather than the preceding description, and all variations and equivalents thereof that fall within the range of the claims are intended to be embraced therein.

What is claimed is:

1. An adaptive sliding block Viterbi decoder (ASBVD), comprising:
   forward and backward Viterbi processors configured to generate metrics of states and of transitions between the states associated with an encoder, based on encoded input information symbols received via a communications channel, wherein each processor includes a plurality of buffers for storing information symbols so that a number of the encoded input information symbols can be concurrently decoded;
   a state estimator configured to estimate a current state of a code trellis based on the generated metrics, wherein the processors decode the stored information symbols based on the estimated current state; and
   a control unit configured to adapt the number of encoded input information symbols to be concurrently decoded based on a condition of the communications channel and to selectively control the operational state of the buffers such that buffers are enabled and disabled in accordance with the number of encoded input information symbols to be concurrently decoded, wherein each of the processors comprises:
a first buffer unit including buffers for storing the encoded input information symbols;
a first metric unit configured to generate the metrics of the transitions between the states based on the stored encoded input information symbols;
a second metric unit configured to generate the metrics of the states based on the metrics of the transitions between the states;
a second buffer unit including buffers for storing information symbols output from the second metric unit;
a traceback unit configured to decode the stored information symbols output from the second metric unit based on the estimated current state and output a sequence of most likely transmitted information symbols; and
a third buffer unit including buffers for storing the sequence of most likely transmitted information symbols to generate decoded output information bits.

2. The ASBVD of claim 1, wherein the control unit is configured to generate control signals that control the traceback units.

3. The ASBVD of claim 1, wherein the control unit is configured to generate control signals that control the second and third buffer units.

4. The ASBVD of claim 3, wherein the second and third buffer units each includes M/2 parallel branches of skew buffers, wherein M corresponds to the number of information symbols to be concurrently decoded.

5. The ASBVD of claim 4, wherein in response to a decrease in the number M, the control unit generates control signals that selectively disable the branches of skew buffers in the buffer units.

6. The ASBVD of claim 5, wherein the control signals disable a number of the branches of skew buffers based on an amount by which the number M is decreased.

7. The ASBVD of claim 5, wherein the control signals disable clock signals or power signals associated with the branches of skew buffers to be disabled.

8. The ASBVD of claim 4, wherein in response to an increase in the number M, the control unit generates control signals that selectively enable currently disabled branches of skew buffers in the buffer units.

9. The ASBVD of claim 8, wherein the control signals enable a number of the branches of skew buffers based on an amount by which the number M is increased.

10. The ASBVD of claim 8, wherein the control signals enable clock signals or power signals associated with the branches of skew buffers to be enabled.

11. The ASBVD of claim 1, wherein the control unit is configured to adapt the number of information symbols to be concurrently decoded based on a data rate of the communications channel.

12. A system for adaptive sliding block Viterbi decoding, comprising:
means for adapting a number of encoded input information symbols to be concurrently decoded based on a condition of a communications channel via which the encoded input information symbols are received;
means for forward processing and backward processing the encoded input information symbols to generate metrics of states and of transitions between the states associated with an encoder, wherein the processing means includes a plurality of means for storing information symbols so that the number of encoded input information symbols can be concurrently decoded;
means for controlling the operational state of the means for storing such that means are enabled and disabled in accordance with the number of encoded input information symbols to be concurrently decoded; and
means for estimating a current state of a code trellis based on the generated metrics,
wherein the processing means includes means for decoding the stored information symbols based on the estimated current state, wherein the means for forward and backward processing the encoded input information symbols further comprises:
means for storing the encoded input information symbols using first buffer units;
means for generating the metrics of the transitions between the states based on the stored input information symbols;
means for generating the metrics of the states based on the metrics of the transitions between the states:
means for storing information symbols output following the means of generating the metrics of the states using second buffer units;
means for decoding the stored output information symbols based on the estimated current state to produce a sequence of most likely transmitted information symbols; and
means for storing the sequence of most likely transmitted information symbols to generate decoded output information bits using third buffer units.

13. A method for adaptive sliding block Viterbi decoding, comprising:
adapting a number of encoded input information symbols to be concurrently decoded based on a condition of a communications channel via which the encoded input information symbols are received;
forward and backward processing the encoded input information symbols to generate metrics of states and of transitions between the states associated with an encoder, wherein the step of processing includes storing the information symbols using a plurality of buffers so that the number of encoded input information symbols can be concurrently decoded;
controlling the operational state of the buffers such that buffers are enabled and disabled in accordance with the number of encoded input information symbols to be concurrently decoded; and
estimating a current state of a code trellis based on the generated metrics, wherein the step of processing includes decoding the stored information symbols based on the estimated current state, wherein the forward and backward processing comprises:
storing the encoded input information symbols using first buffer units;
generating the metrics of the transitions between the states based on the stored input information symbols;
generating the metrics of the states based on the metrics of the transitions between the states;
storing information symbols output following the step of generating the metrics of the states using second buffer units;
decoding the stored output information symbols based on the estimated current state to produce a sequence of most likely transmitted information symbols; and
storing the sequence of most likely transmitted information symbols to generate decoded output information bits using third buffer units.

14. The method of claim 13, wherein the step of adapting the number of encoded input information symbols to be concurrently decoded comprises:
adapting the number of encoded input information symbols to be concurrently decoded based on a data rate of the communications channel.

15. The method of claim 13, wherein the step of controlling the operational state of the buffers comprises:
generating control signals for controlling the second and third buffer units.

16. The method of claim 15, wherein the step of generating control signals comprises:
generating control signals to selectively disable branches of skew buffers in the buffer units in response to a decrease in the number of encoded input information symbols to be concurrently decoded, wherein the second and third buffer units each includes M/2 parallel branches of skew buffers and wherein M corresponds to the number of information symbols to be concurrently decoded.

17. The method of claim 16, wherein the step of generating control signals comprises:
generating control signals to disable clock signals or power signals associated with the branches of skew buffers to be disabled.

18. The method of claim 15, wherein the step of generating control signals comprises:
generating control signals to selectively enable currently disabled branches of skew buffers in the buffer units in response to an increase in the number of encoded input information symbols to be concurrently decoded, wherein the second and third buffer units each includes M/2 parallel branches of skew buffers and wherein M corresponds to the number of information symbols to be concurrently decoded.

19. The method of claim 18, wherein the step of generating control signals comprises:
generating control signals to enable clock signals or power signals associated with the branches of skew buffers to be enabled.

20. An adaptive decoder, comprising:
first and second processors configured to generate metrics of states and of transitions between the states associated with an encoder, based on encoded input information symbols received via a communications channel, wherein each processor includes a plurality of buffers for storing information symbols so that a number of the encoded input information symbols can be concurrently decoded;
a state estimator configured to estimate a current state of a code trellis based on the generated metrics, wherein the processors decode the stored information symbols based on the estimated current state; and
a control unit configured to adapt the number of encoded input information symbols to be concurrently decoded based on a condition of the communications channel and to selectively control the operational state of the buffers such that buffers are enabled and disabled in accordance with the number of encoded input information symbols to be concurrently decoded, wherein each of the processors comprises:
a first buffer unit including buffers for storing the encoded input information symbols;
a first metric unit configured to generate the metrics of the transitions between the states based on the stored encoded input information symbols;
a second metric unit configured to generate the metrics of the states based on the metrics of the transitions between the states;
a second buffer unit including buffers for storing information symbols output from the second metric unit;
a traceback unit configured to decode the stored information symbols output from the second metric unit based on the estimated current state and output a sequence of most likely transmitted information symbols; and
a third buffer unit including buffers for storing the sequence of most likely transmitted information symbols to generate decoded output information bits.

21. The adaptive decoder of claim 20, wherein the adaptive decoder comprises an adaptive sliding block Viterbi decoder (ASBVD).

22. The adaptive decoder of claim 21, wherein the first and second processors comprise forward and backward Viterbi processors.

* * * * *